(12) United States Patent
Liu et al.

(10) Patent No.: US 8,829,941 B2
(45) Date of Patent: Sep. 9, 2014

(54) LOW-POWER HIGH-GAIN MULTISTAGE COMPARATOR CIRCUIT

(75) Inventors: Xin Liu, El Dorado Hills, CA (US); Arvind Bomdica, Fremont, CA (US); Yikai Liang, Freemont, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 13/316,488

(22) Filed: Dec. 10, 2011

(65) Prior Publication Data

US 2013/0147554 A1     Jun. 13, 2013

(51) Int. Cl.
 *H03K 5/22*     (2006.01)

(52) U.S. Cl.
 USPC .......................................................... 327/65

(58) Field of Classification Search
 USPC .................................................... 327/65, 66
 See application file for complete search history.

(56) References Cited

U.S. PATENT DOCUMENTS

| | | | | |
|---|---|---|---|---|
| 3,745,261 A | * | 7/1973 | Friedman | 379/394 |
| 3,945,374 A | * | 3/1976 | McClure | 600/546 |
| 4,835,489 A | * | 5/1989 | Monticelli | 330/277 |
| 5,065,045 A | * | 11/1991 | Mok | 327/63 |
| 5,087,830 A | * | 2/1992 | Cave et al. | 327/539 |
| 5,148,118 A | * | 9/1992 | Dobkin et al. | 330/252 |
| 5,638,072 A | * | 6/1997 | Van Auken et al. | 341/141 |
| 6,107,887 A | * | 8/2000 | Zucker et al. | 330/301 |
| 7,414,462 B2 | * | 8/2008 | Tripathi et al. | 327/563 |
| 7,495,422 B2 | * | 2/2009 | Mok et al. | 323/280 |
| 7,675,323 B2 | * | 3/2010 | Murata | 326/82 |
| 7,696,789 B2 | * | 4/2010 | Matsui | 327/40 |
| 7,973,569 B1 | * | 7/2011 | Bashar | 327/67 |
| 7,994,807 B1 | * | 8/2011 | Koh et al. | 324/750.3 |
| 8,368,577 B2 | * | 2/2013 | Aruga et al. | 341/172 |
| 8,432,348 B2 | * | 4/2013 | Matsumoto et al. | 345/98 |
| 8,441,266 B1 | * | 5/2013 | Xiao et al. | 324/550 |
| 2004/0249873 A1 | * | 12/2004 | Stark et al. | 708/207 |
| 2008/0144243 A1 | * | 6/2008 | Mariani et al. | 361/56 |
| 2009/0021282 A1 | * | 1/2009 | Matsui | 327/40 |
| 2010/0039426 A1 | * | 2/2010 | Matsumoto et al. | 345/214 |

* cited by examiner

*Primary Examiner* — William Hernandez
(74) *Attorney, Agent, or Firm* — Williams Morgan, P.C.

(57) ABSTRACT

A method is provided for receiving a differential signal pair input at a first circuit stage and converting the differential signal pair input to a single-ended signal at a second circuit stage. The method also provides for receiving an output of the first circuit stage and an output of the second stage at a third circuit stage and transmitting an amplified signal output from the third circuit stage. The method allows for a 60 dB signal gain or more. A circuit is also provided that includes multiple circuit stages that can provide signal gain to an input differential signal pair. The circuit converts the differential pair into a single-ended signal and transmits the amplified signal as an output. The circuit provides the signal gain without using a current mirror. A computer readable storage device encoded with data for adapting a manufacturing facility to create an apparatus is also provided.

22 Claims, 6 Drawing Sheets

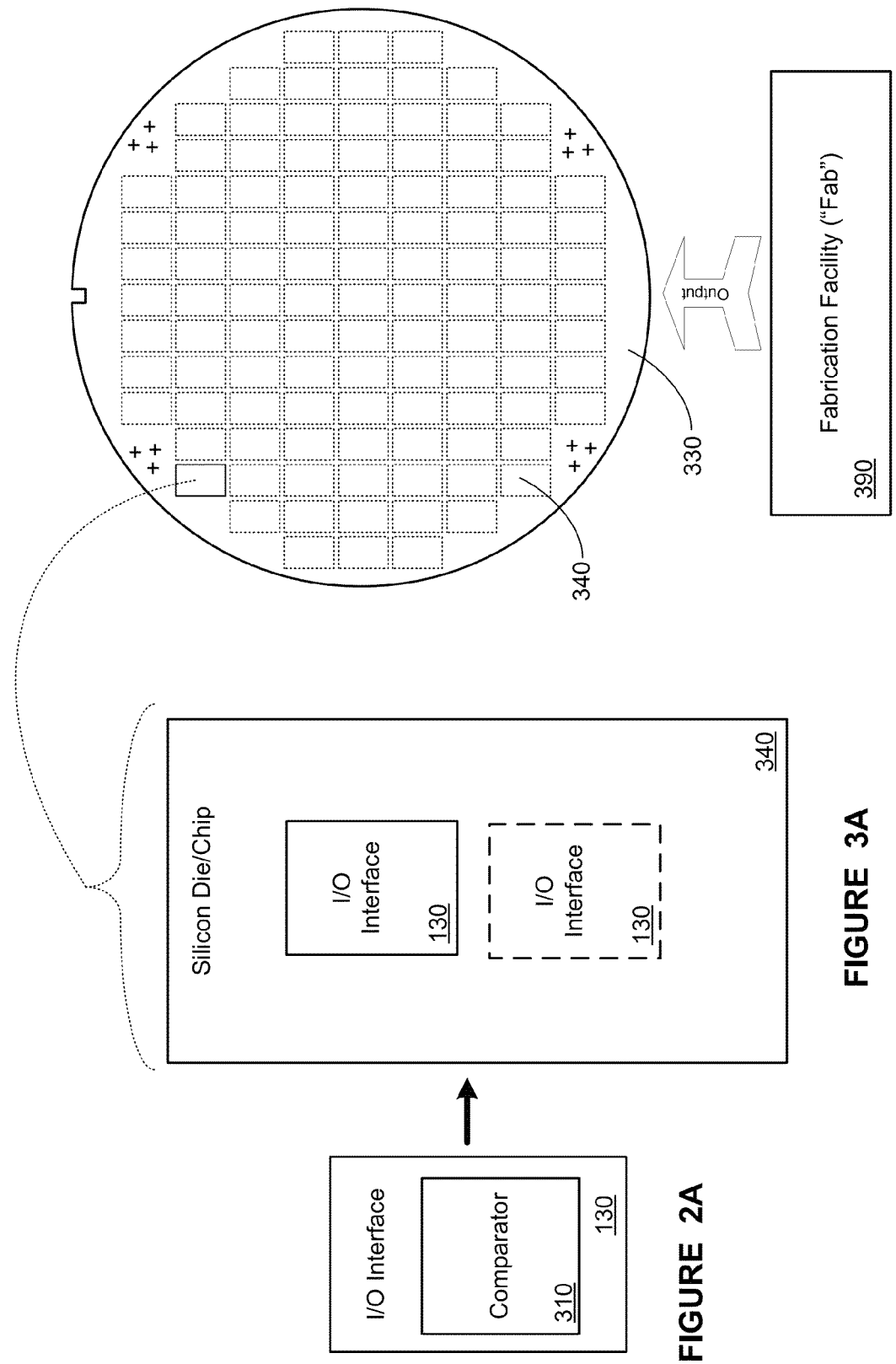

LOW-POWER HIGH-GAIN MULTISTAGE COMPARATOR CIRCUIT

BACKGROUND

1. Field of the Invention

Embodiments presented herein relate generally to electrical circuits and input/output ("I/O") interfaces, and, more particularly, to a method and circuit for a low-power, high-gain multistage comparator.

2. Description of Related Art

Electrical circuits and devices that store and transfer data have evolved becoming faster, having larger capacities and transmitting greater amounts of data. With the increased speed, capacity and bandwidth capabilities of electrical circuits and data storage devices, I/O interfaces must be adapted to be compatible with new system and technology requirements. As technologies for electrical circuits, communications and data storage devices have progressed, there has developed a greater need for efficiency, reliability and stability, particularly in the area of I/O interfaces. However, considerations for voltage, current, signal speed, drive strength and power consumption introduce substantial barriers to efficiently receiving and transmitting signals for I/O interfaces. Parameters such as high-gain and low-current gains for differential signal receiving and transmitting are particularly problematic.

Typically, in modern implementations for I/O interfaces, current mirrors are used to generate reference and bias voltages for signal comparator stages by providing voltage values to inverters in a comparator. However, current mirrors are inadequate to provide additional gain and require extra circuitry and power drain (put another way, biased inverters do not overcome barriers for the parameters discussed above (e.g., power consumption and/or signal amplitude)). That is, supplying a reference voltage signal to an inverter stage of a comparator from a current mirror does not improve the gain of the comparator and reduces overall circuit performance/efficiency (e.g., by sinking current and dissipating power) as used state of the art solutions. Digital inverters, such as those formed from an nFET/pFET pair, do not produce gain, and current mirrors use additional circuit power.

Embodiments presented herein eliminate or alleviate the problems inherent in the state of the art described above.

SUMMARY OF EMBODIMENTS

In one aspect of the present invention, a method is provided. The method includes receiving a differential signal pair input at a first circuit stage and converting the differential signal pair input to a single-ended signal at a second circuit stage. The method also includes receiving an output of the first circuit stage and an output of the second stage at a third circuit stage and transmitting an amplified signal output from the third circuit stage.

In another aspect of the invention, a circuit is provided. The circuit includes a first circuit stage that comprises a differential signal pair input portion and a first stage output portion, and a second circuit stage that comprises a differential signal to single-ended signal converter portion, the second circuit stage being electrically connected to the first circuit stage output portion. The circuit also includes a third circuit stage that comprises an amplifier portion and a third circuit stage input portion, where the third stage input signal portion is electrically connected to the first circuit stage output portion and to the second circuit stage output portion.

In yet another aspect of the invention, a computer readable storage device encoded with data that, when implemented in a manufacturing facility, adapts the manufacturing facility to create an apparatus is provided. The apparatus includes a first circuit stage that comprises a differential signal pair input portion and a first stage output portion, and a second circuit stage that comprises a differential signal to single-ended signal converter portion, the second circuit stage being electrically connected to the first circuit stage output portion. The apparatus also includes a third circuit stage that comprises an amplifier portion and a third circuit stage input portion, where the third stage input signal portion is electrically connected to the first circuit stage output portion and to the second circuit stage output portion.

BRIEF DESCRIPTION OF THE DRAWINGS

The embodiments herein may be understood by reference to the following description taken in conjunction with the accompanying drawings, in which the leftmost significant digit(s) in the reference numerals denote(s) the first figure in which the respective reference numerals appear, and in which:

FIG. 2A shows a simplified block diagram of an I/O interface that includes a comparator circuit, according to one embodiment;

FIG. 3A provides a representation of a silicon die/chip that includes one or more I/O interfaces, according to one embodiment;

FIG. 3B provides a representation of a silicon wafer which includes one or more die/chips that may be produced in a fabrication facility, according to one embodiment;

Figure 1:
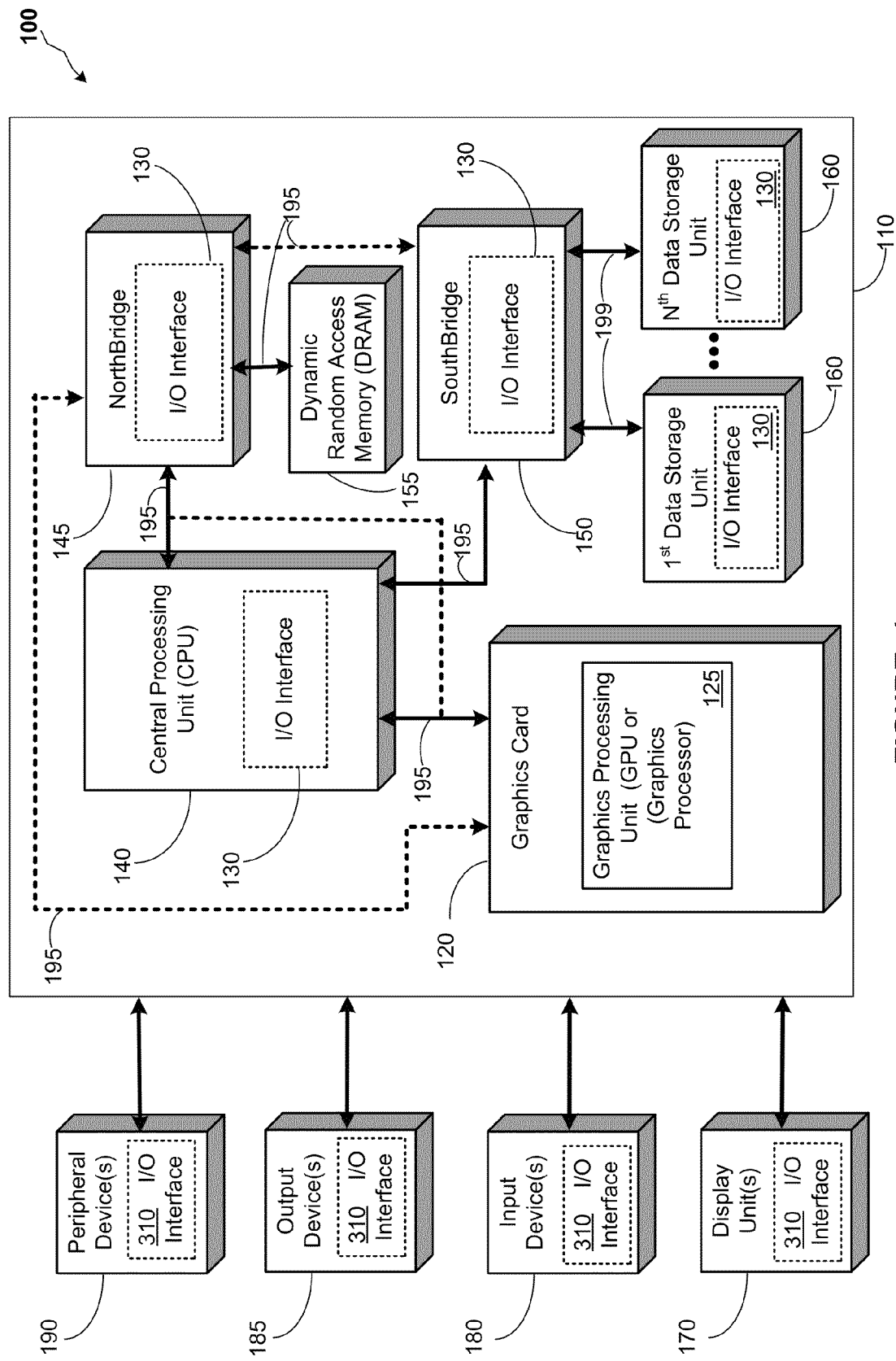
FIG. 1 schematically illustrates a simplified block diagram of a computer system including one or more input/output ("I/O") interfaces, according to one embodiment.

While the embodiments herein are susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the scope of the invention as defined by the appended claims.

DETAILED DESCRIPTION

Illustrative embodiments of the instant application are described below. In the interest of clarity, not all features of an actual implementation are described in this specification. It will of course be appreciated that in the development of any such actual embodiment, numerous implementation-specific decisions may be made to achieve the developers' specific goals, such as compliance with system-related and/or business-related constraints, which may vary from one implementation to another. Moreover, it will be appreciated that such a development effort might be complex and time-consuming, but may nevertheless be a routine undertaking for those of ordinary skill in the art having the benefit of this disclosure.

Embodiments of the present application will now be described with reference to the attached figures. Various structures, connections, systems and devices are schematically depicted in the drawings for purposes of explanation only and so as to not obscure the disclosed subject matter with details that are well known to those skilled in the art. Nevertheless, the attached drawings are included to describe and explain illustrative examples of the present embodiments. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used herein, the suffixes "_b" and "_n" (or "b" and "n") denote a signal that is active-low (i.e., the signal is activated or enabled when a logical '0' is applied to the signal). Signals not having these suffixes may be active-high (i.e., the signal is activated or enabled when a logical '1' is applied to the signal). While various embodiments and Figures herein are described in terms active-high and active-low signals, it is noted that such descriptions are for illustrative purposes of various embodiments and that alternate configurations are contemplated in other embodiments not explicitly described in this disclosure.

For discussion purposes, it is assumed that a digital signal 0 may approximately equal 0V (i.e., GND node 406) and a digital signal 1 may approximately equal the VDD node 407. In alternate embodiments it is contemplated that values other than the GND 406 and the VDD 407 may be used for digital signals 0 and 1 respectively. In various embodiments, the VDD 407 may be 5.0V, 2.5V, 1.0V or another voltage level as required.

As used herein, the terms "substantially" and "approximately" may mean within 85%, 90%, 95%, 98% and/or 99%. In some cases, as would be understood by a person of ordinary skill in the art, the terms "substantially" and "approximately" may indicate that differences, while perceptible, may be negligent or be small enough to be ignored. Additionally, the term "approximately," when used in the context of one value being approximately equal to another, may mean that the values are "about" equal to each other. For example, when measured, the values may be close enough to be determined as equal by one of ordinary skill in the art.

As shown in the Figures and as described below, the circuits described herein may comprise various circuit components such as, but not limited to, metal oxide semiconductor field effect transistors ("MOSFETs"), resistors, capacitors, power node(s) and ground node(s). The MOSFETs may be n-type (nFET) or p-type (pFET), as would be known to a person of ordinary skill in the art. Similarly, the power nodes may be of an implementation specific and/or variable voltage level, as would be known to a person of ordinary skill in the art. In one or more embodiments, the nFETs and/or pFETs described herein may operate as switches. For example, the nFETs and/or pFETs may operate to complete circuit paths to allow the flow of current, and/or to drive signals.

Embodiments of the present application generally provide for low-current, high-gain multistage comparators. It is contemplated that various embodiments described herein are not mutually exclusive. That is, the various embodiments described herein may be implemented simultaneously with, or independently of, each other, as would be apparent to one of ordinary skill in the art having the benefit of this disclosure. Various embodiments herein may be described in terms of Universal Serial Bus ("USB") I/O interfaces and standards (e.g., USB 3.0). However, it should be noted that such descriptions are used in order to provide a basis for illustration and understanding of the embodiments presented herein. That is, the embodiments provided in this disclosure are not limited to USB, but rather may be applied to other I/O interfaces as would be apparent to one of ordinary skill in the art having the benefit of this disclosure. For example, low-, mid-, and/or high-speed communications requiring low-current, high-gain comparators may benefit from the embodiments described herein.

Comparators, as described in embodiments herein, may take two inputs (e.g., a differential signal pair) and convert the two inputs into a single output (e.g., a single-ended, digital signal). Comparators may additionally provide a signal gain to the output signal over the input signal. Comparators may include multiple stages, and prior art implementations include two gain stages.

High speed I/O interfaces, such as USB 3.0, may transmit data at speeds up to 5 Gb/s (e.g., in USB 3.0), but may use low frequency periodic signaling (LFPS) to communicate initialization and power management information. LFPS signaling in USB 3.0, for example, may use frequencies as low as 10 MHz to 50 MHz. Because of the plug-and-play nature of USB, the LFPS detectors remain on or active in order to detect in-coming USB signals from USB devices. For this reason, the LFPS detectors may be required to consume very little power (as little as 50 micro amps or less in some implementations. The LFPS detectors, however, may also be required to amplify incoming signals by 60 decibels (dB) (i.e., have a small-signal gain of about 60 dB) or more and transmit the amplified signals to other circuitry. Such transmissions may be on high-capacitance connections. Therefore, it is difficult to tightly control currents and output voltages and simultaneously meet different parameter requirements.

The embodiments described herein show a novel design and method that efficiently solves this problem. The embodiments described herein may show a multistage comparator circuit with low current consumption and high gain. The embodiments described herein may show such a multistage comparator circuit that does not use a current mirror to generate a reference voltage for a comparator stage. The embodiments described herein may allow for a gain of 20 dB at multiple comparator stages (e.g., at one, two, and/or three stages) for a comparator gain of about 60 dB or more. The embodiments described herein may allow for a comparator current usage of about 50 µA (i.e., about 50 micro amps) or less.

Turning now to FIG. 1, a block diagram of an exemplary computer system 100, in accordance with an embodiment of the present application, is illustrated. In various embodiments the computer system 100 may be a personal computer, a laptop computer, a handheld computer, a tablet computer, a mobile device, a telephone, a personal data assistant ("PDA"), a server, a mainframe, a work terminal, a music player, and/or the like. The computer system includes a main structure 110 which may be a computer motherboard, circuit board or printed circuit board, a desktop computer enclosure and/or tower, a laptop computer base, a server enclosure, part of a mobile device, personal digital assistant (PDA), or the like. In one embodiment, the main structure 110 includes a graphics card 120. In one embodiment, the graphics card 120 may be a Radeon™ graphics card from Advanced Micro Devices ("AMD") or any other graphics card using memory, in alternate embodiments. The graphics card 120 may, in different embodiments, be connected on a Peripheral Component Interconnect "(PCI") Bus (not shown), PCI-Express Bus (not shown) an Accelerated Graphics Port ("AGP") Bus (also not shown), or any other connection known in the art. It should be noted that embodiments of the present application are not limited by the connectivity of the graphics card 120 to the main computer structure 110. In one or more embodiments, the CPU 140 (discussed below) may be a single- or multi-core processor, or may be a combination of one or more CPU cores and a GPU core on a single die/chip (such an AMD Fusion™ APU device). In one embodiment, computer runs an operating system such as Linux, Unix, Windows, Mac OS, or the like.

In one embodiment, the graphics card 120 may contain a graphics processing unit (GPU) 125 used in processing graphics data. The GPU 125, in one embodiment, may include one or more embedded memories (not shown). In one embodiment, the embedded memory(ies) may be an embedded random access memory ("RAM"), an embedded static random access memory ("SRAM"), or an embedded dynamic random access memory ("DRAM"). In one or more embodiments, the embedded memory(ies) may be an embedded RAM (e.g., an SRAM). In alternate embodiments, the embedded memory(ies) may be embedded in the graphics card 120 in addition to, or instead of, being embedded in the GPU 125. In various embodiments the graphics card 120 may be referred to as a circuit board or a printed circuit board or a daughter card or the like.

In one embodiment, the computer system 100 includes a central processing unit ("CPU") 140, which is connected to a northbridge 145. In one or more embodiments, the CPU 140 may be a single- or multi-core processor, or may be a combination of one or more CPU cores and a GPU core on a single die/chip (such an AMD Fusion™ APU device). The CPU 140 and northbridge 145 may be housed on the motherboard (not shown) or some other structure of the computer system 100. It is contemplated that in certain embodiments, the graphics card 120 may be coupled to the CPU 140 via the northbridge 145 or some other connection as is known in the art. For example, CPU 140, northbridge 145, GPU 125 may be included in a single package or as part of a single die or "chips" (not shown). Alternative embodiments which alter the arrangement of various components illustrated as forming part of main structure 110 are also contemplated. The CPU 140 and/or the northbridge 145, in certain embodiments, may each include one or more I/O interfaces 130. In certain embodiments, the northbridge 145 may be coupled to a system RAM (or DRAM) 155; in other embodiments, the system RAM 155 may be coupled directly to the CPU 140. The system RAM 155 may be of any RAM type known in the art; the type of RAM 155 does not limit the embodiments of the present application. In one embodiment, the northbridge 145 may be connected to a southbridge 150. In other embodiments, the northbridge 145 and southbridge 150 may be on the same chip in the computer system 100, or the northbridge 145 and southbridge 150 may be on different chips. In one embodiment, the southbridge 150 may have one or more I/O interfaces 130, in addition to any other I/O interfaces 130 elsewhere in the computer system 100. In various embodiments, the southbridge 150 may be connected to one or more data storage units 160 using a data connection or bus 199. The data storage units 160 may be hard drives, solid state drives, magnetic tape, or any other writable media used for storing data. In one embodiment, one or more of the data storage units may be USB storage units and the data connection 199 may be a USB bus/connection. Additionally, the data storage units 160 may contain one or more I/O interfaces 130. In various embodiments, the central processing unit 140, northbridge 145, southbridge 150, graphics processing unit 125, DRAM 155 and/or embedded RAM may be a computer chip or a silicon-based computer chip, or may be part of a computer chip or a silicon-based computer chip. In one or more embodiments, the various components of the computer system 100 may be operatively, electrically and/or physically connected or linked with a bus 195 or more than one bus 195.

In different embodiments, the computer system 100 may be connected to one or more display units 170, input devices 180, output devices 185 and/or other peripheral devices 190. It is contemplated that in various embodiments, these elements may be internal or external to the computer system 100, and may be wired or wirelessly connected, without affecting the scope of the embodiments of the present application. The display units 170 may be internal or external monitors, television screens, handheld device displays, and the like. The input devices 180 may be any one of a keyboard, mouse, track-ball, stylus, mouse pad, mouse button, joystick, scanner or the like. The output devices 185 may be any one of a monitor, printer, plotter, copier or other output device. The peripheral devices 190 may be any other device which can be coupled to a computer: a CD/DVD drive capable of reading and/or writing to corresponding physical digital media, a universal serial bus ("USB") device, Zip Drive, external floppy drive, external hard drive, phone and/or broadband modem, router/gateway, access point and/or the like. The input, output, display and peripheral devices/units described herein may have USB connections in some embodiments. To the extent certain exemplary aspects of the computer system 100 are not described herein, such exemplary aspects may or may not be included in various embodiments without limiting the spirit and scope of the embodiments of the present application as would be understood by one of skill in the art.

Turning now to FIG. 2A, a block diagram of an exemplary I/O interface 130, in accordance with an embodiment of the present application, is illustrated. In one embodiment, the I/O interface 130 may contain one or more comparator circuits 310 that may be used to provide signal gain. The I/O interface 130, in one embodiment, may include a low-current, high-gain multistage comparator 310, described in further detail below. To the extent certain exemplary aspects of the I/O interface 130 and/or the comparator 310 are not described herein, such exemplary aspects may or may not be included in various embodiments without limiting the spirit and scope of the embodiments of the present application as would be understood by one of skill in the art. For example, I/O interfaces 130 and/or comparators 310 may be adapted to perform I/O processes for different data connection standards such as USB, SATA and/or the like.

Figure 2B:
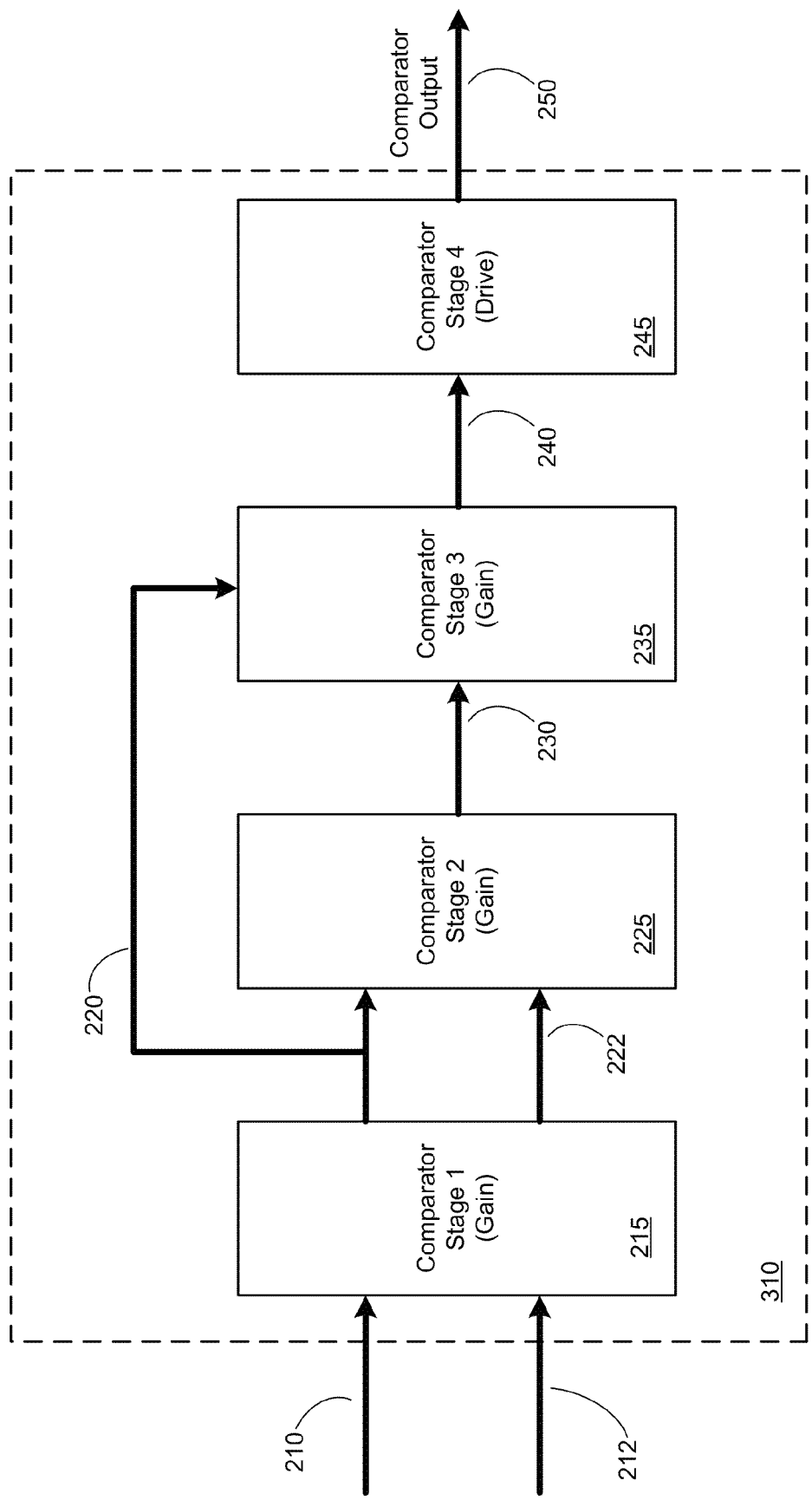
FIG. 2B shows a simplified block diagram of a comparator circuit, according to one embodiment.

Turning now to FIG. 2B, a simplified block diagram of a comparator 310 circuit is depicted, according to one embodiment. In one embodiment, the comparator 310 may include a pair of differential inputs 210/212 that may be received by a first stage 215 of the comparator. The first stage 215 may be a gain stage adapted to provide a gain to the differential input signals on 210/212 of about 20 dB or more. The first stage 215 may also be adapted to provide small signal outputs on 220/222 to a second comparator stage 225, and may also be adapted to provide the small signal output on 220 to a third comparator stage 235. The second stage 225 may convert the small signals on 220/222 to a single-ended signal 230. The second stage 225 may be a gain stage and may also be adapted to provide a gain to the small signals on 220/222 of about 20 dB or more. That is, the single-ended output on 230 of the second stage 225 may have a gain of about 20 dB or more over the small signals on 220/222. The third stage 235 may be a gain stage and may be adapted to receive the single-ended signal on 230 and the small signal on 220, and the third stage 235 may be adapted to use these signals to provide an amplified single-ended signal on 240. The single-ended signal on 240 may have a gain of about 20 dB or more over the single-ended output on 230. The single-ended signal on 240 may also have a gain of about 60 dB or more over the differential input signals on 210/212. The fourth stage 245 may be a drive stage and may be adapted to drive the single-ended signal on 240 as a single-ended comparator output signal on 250. The fourth stage 245 may be adapted to drive the single-ended comparator output signal on 250 on a connection with a high capacitive load. The single-ended comparator output signal on 250 may also have a gain of about 60 dB or more over the differential input signals on 210/212. The comparator 310, in one embodiment as depicted in FIG. 2B, may be a multi-stage comparator and may be adapted to provide a high signal gain. The exemplary stages (e.g., 215, 225, 235, 245) of the comparator 310 depicted in FIG. 2B will be discussed in further detail below.

Turning now to FIG. 3A, in one embodiment, the I/O interface(s) 130 and the comparators 310 may reside on a silicon chips/die 340 and/or in the computer system 100 components such as those depicted in FIG. 1. The silicon chip(s) 340 may be housed on the motherboard (not shown) or other structure of the computer system 100. In one or more embodiments, there may be more than one I/O interface 130 and/or comparator 310 on each silicon chip/die 340. As discussed above, various embodiments of the I/O interface 130 may be used in a wide variety of electronic devices, including, but not limited to, southbridge devices, central processing units, northbridge devices, motherboards, graphics cards, input devices, output devices, peripheral devices, display devices combinatorial logic implementations, stand-alone controllers, other integrated circuits (ICs), or the like.

Turning now to FIG. 3B in accordance with one embodiment, and as described above, one or more of the I/O interfaces 130 may be included on the silicon die/chips 340 (or computer chip). The silicon die/chips 340 may contain one or more different configurations of the I/O interfaces 130 (e.g., I/O interfaces 130 configured to perform according to one or more connection standards, such as USB or SATA). The silicon chips 340 may be produced on a silicon wafer 330 in a fabrication facility (or "fab") 390. That is, the silicon wafers 330 and the silicon die/chips 340 may be referred to as the output, or product of, the fab 390. The silicon die/chips 340 may be used in electronic devices, such as those described above in this disclosure.

Figure 4:
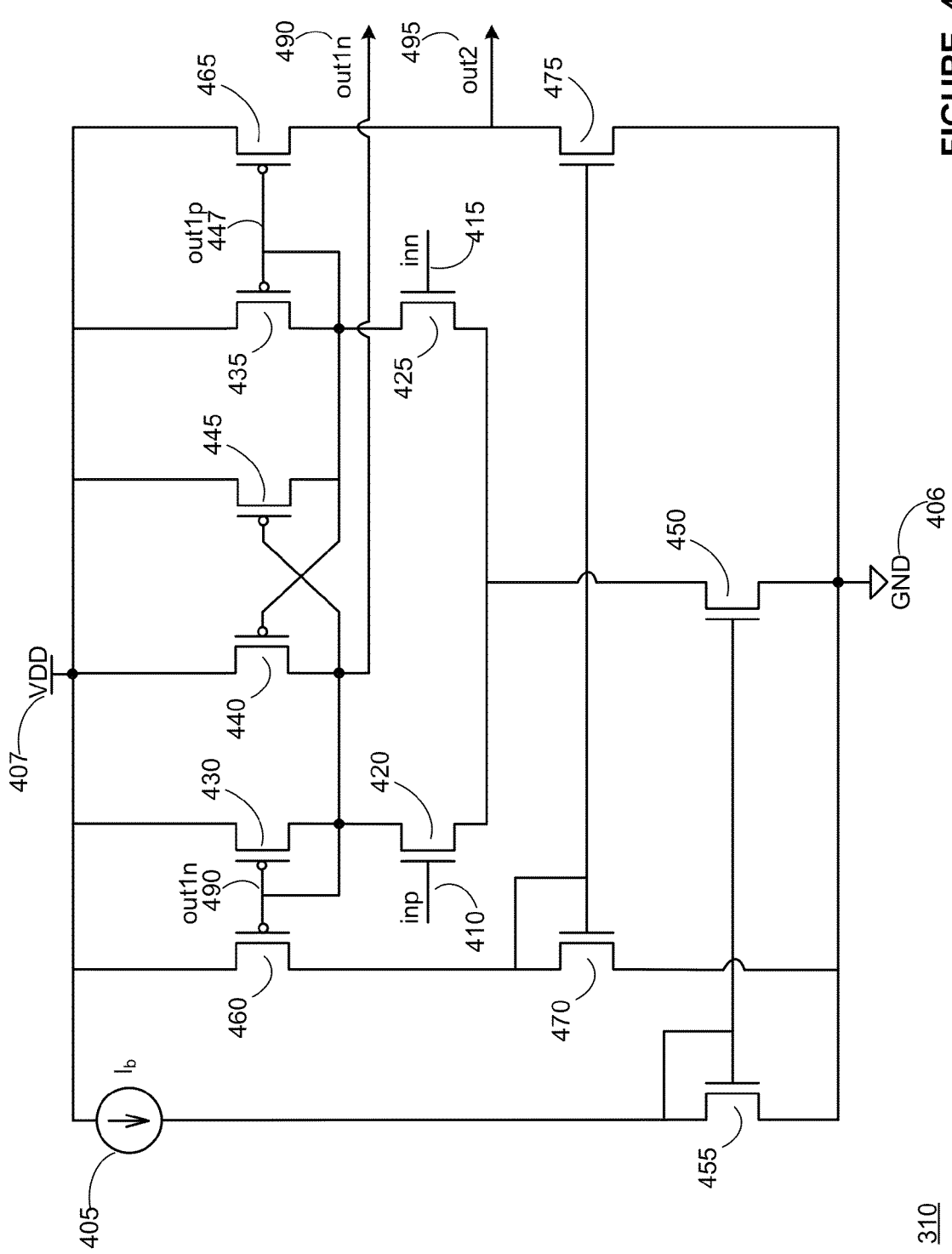
FIG. 4 illustrates a schematic diagram of a portion of a comparator circuit in an I/O interface as provided in FIGS. 1-3B, according to one embodiment.

Turning now to FIG. 4, a circuit diagram of an exemplary implementation of a portion of the comparator 310 is illustrated, according to on embodiment. In one embodiment, the portion of the comparator 310 illustrated in FIG. 4 comprises a first stage and a second stage of the comparator 310, discussed in further detail below. In accordance with one embodiment, the comparator 310 may include a voltage node VDD 407 and a ground node GND 406. The comparator 310 may also include a current source 405 that has its input connected to the VDD 407 and that provides a current Ib to the comparator 310 circuit. The comparator 310 may include a pair of differential input terminals inp 410 and inn 415 that are adapted to receive a differential signal pair as input. In one embodiment, the inp 410 and the inn 415 may be the inputs to the comparator 310. The inp 410 may be connected to the gate of an nFET 420, and the inn 415 may be connected to the gate of an nFET 425. The nFETs 420 and 425 may have their respective sources connected together. The drain of the nFET 420 may be connected to gates of pFETs 430, 445 and 460, and to the drains of the pFETs 430 and 440 via node outln 490. The drain of the nFET 425 may be connected to the gates of the pFETs 435, 440 and 465, and to the drains of the pFETs 435 and 445 via node outlp 447. The sources of the pFETs 430, 435, 440, 445, 460 and 465 may each be connected to the VDD 407. The drain of the pFET 460 may be connected to the gate and the drain of an nFET 470. The gate of the nFET 470 may be connected to the drain of the nFET 470 and to the gate of an nFET 475. The source of the nFET 470 may be connected to GND 406. The drain of the nFET 475 may be connected to the drain of the pFET 465 via node out2 495. The source of the nFET 475 may be connected to the GND 406. The connected sources of the nFETs 420 and 425 may be connected to the drain of an nFET 450. The nFET 450 may have its source connected to the GND 406 and may have its gate connected to the gate of an nFET 455. The nFET 450 may, in one or more embodiments, provide a tail current to the comparator 310 circuit. The nFET 455 may have its drain and its gate connected to each other and may have its source connected to the GND 406. The nFET 455 may have its drain connected to the output of the current source 405. In one embodiment, a resistor (not shown) may be included between the output of the current source 405 and the drain of the nFET 455.

In one embodiment, the comparator 310 circuit portion depicted in FIG. 4 may include two comparator gain stages: a first stage and a second stage. The first stage may include the nFETs 420 and 425 as well as the pFETs 430, 435, 440 and 445. In one embodiment, the output of the first stage may be the nodes outln 490 and outlp 447. The first stage may be adapted to provide, as first stage outputs, the signals on the outln 490 and outlp 447 nodes at a gain of about 20 dB or more over the differential signal inputs at the gates of nFETs 420 and 425. The outputs of the first stage may be provided as inputs to the second stage. The second stage may include the nFETs 470 and 475 as well as the pFETs 460 and 465. The second stage may be adapted to provide, as a second stage output signal, the signal on the node out2 495 to a third comparator gain stage (discussed below) at a gain of about 20 dB or more over the second stage input signals (i.e., the first stage output signals on nodes outln 490 and outlp 447). The signal on the node out2 495 may be a single-ended, digital signal, while the signals on the outln 490 and outlp 447 nodes are differential, small signals. In sum, the first and second stages may collectively provide a signal gain of about 40 dB or more over the differential signals at the input terminals inp 410 and inn 415.

Figure 5:
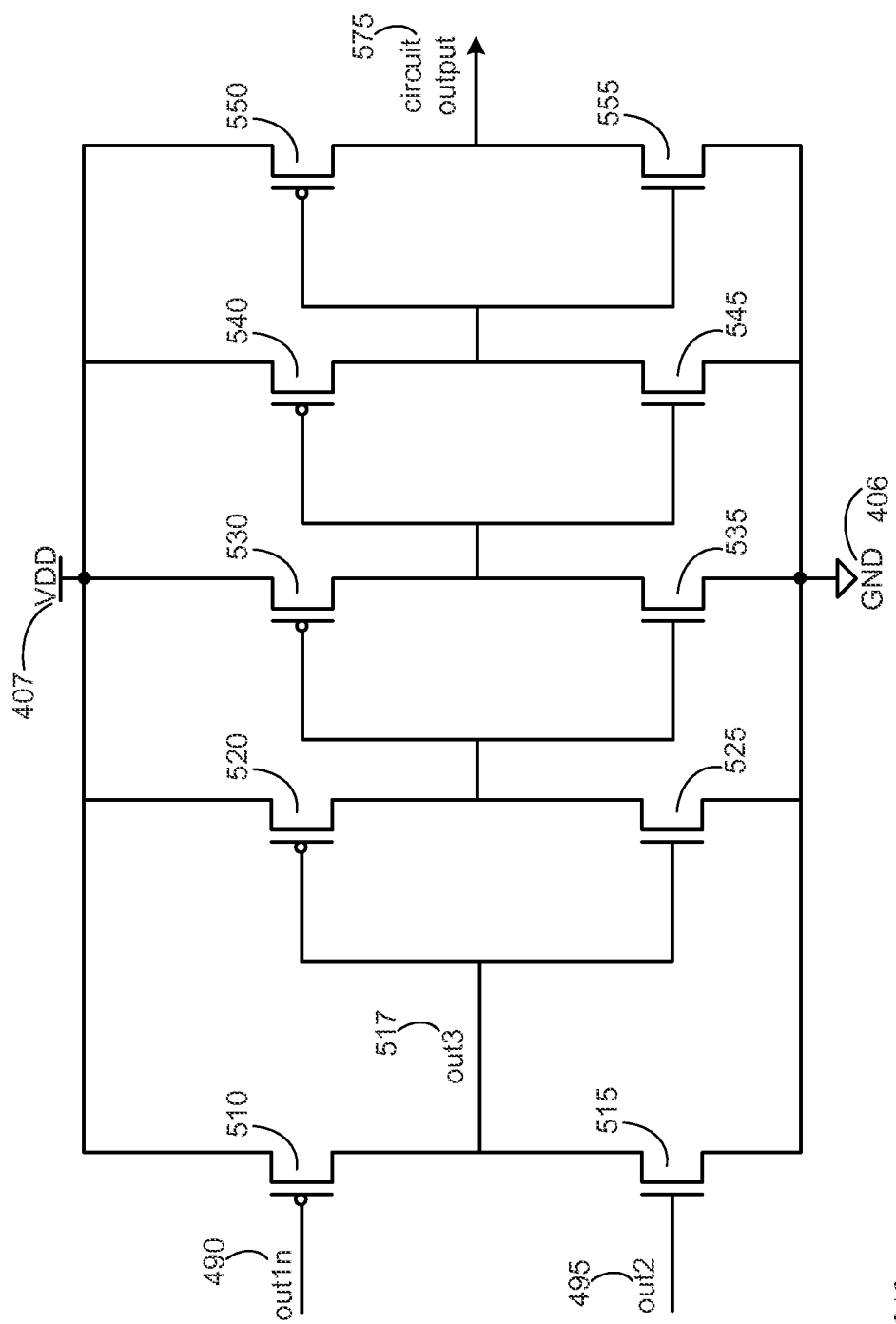
FIG. 5 illustrates a schematic diagram of a portion of a comparator circuit in an I/O interface as provided in FIGS. 1-3B, according to one embodiment.

Turning now to FIG. 5, a circuit diagram of an exemplary implementation of a portion of the comparator 310 is illustrated, according to on embodiment. In one embodiment, the portion of the comparator 310 illustrated in FIG. 5 comprises a third stage and a fourth stage of the comparator 310, discussed in further detail below. In accordance with one embodiment, and as described above with respect to FIG. 4, the comparator 310 may include the voltage node VDD 407 and the ground node GND 406. The comparator 310 circuit may include a pFET 510 and an nFET 515. The pFET 510 may have its gate connected to the node outln 490, and the nFET 515 may have its gate connected to the node out2 495.

The respective drains of the pFET 510 and the nFET 515 may be connected together at node out3 517. The source of the pFET 510 may be connected to the VDD 407, and the source of the nFET 515 may be connected to the GND 406. The comparator 310 circuit may also include a pFET 520 and an nFET 525. The respective gates of the pFET 520 and the nFET 525 may be connected together and connected to the node out3 517. The respective drains of the pFET 520 and the nFET 525 may be connected together. The source of the pFET 520 may be connected to the VDD 407, and the source of the nFET 525 may be connected to the GND 406. The comparator 310 circuit may also include a pFET 530 and an nFET 535. The respective gates of the pFET 530 and the nFET 535 may be connected together and connected to the drains of the pFET 520 and the nFET 525. The respective drains of the pFET 530 and the nFET 535 may be connected together. The source of the pFET 530 may be connected to the VDD 407, and the source of the nFET 535 may be connected to the GND 406. The comparator 310 circuit may also include a pFET 540 and an nFET 545. The respective gates of the pFET 540 and the nFET 545 may be connected together and connected to the drains of the pFET 530 and the nFET 535. The respective drains of the pFET 540 and the nFET 545 may be connected together. The source of the pFET 540 may be connected to the VDD 407, and the source of the nFET 545 may be connected to the GND 406. The comparator 310 circuit may also include a pFET 550 and an nFET 555. The respective gates of the pFET 550 and the nFET 555 may be connected together and connected to the drains of the pFET 540 and the nFET 545. The respective drains of the pFET 550 and the nFET 555 may be connected together. The source of the pFET 550 may be connected to the VDD 407, and the source of the nFET 555 may be connected to the GND 406. The drains of the pFET 550 and the nFET 555 may form a node circuit output 575, which in one or more embodiments, may be the output of the comparator 310.

In one embodiment, the comparator 310 circuit portion depicted in FIG. 5 may include a comparator gain stage (a third stage) and driver stage (a fourth stage). The third stage may include the pFETs 510 and the nFETs 515. In one embodiment, the output of the first stage (e.g., the signal at the node outln 490) and the output of second stage (e.g., the signal at the node out2 495) may be inputs to the third stage. The third stage may provide as an output the signal at the node out3 517. The output of the third stage may be provided as an input to the fourth stage (discussed below). The output of the third stage (i.e., the signal at the node out3 517) may have, in one or more embodiments, a signal gain of about 20 dB or more over the third stage input signal at the node out2 495. It should be noted that the third stage (pFET/nFET pair 510/515) is not an inverter, as described below in with respect to the fourth stage. A digital signal inverter does not provide an output signal gain over an input signal. As shown in FIG. 5, the gate of the pFET 510 is connected to the node outln 490, not the gate of the nFET 515 and node out2 495. That is, the gate of the pFET 510 is connected to a small signal output from the first stage of the comparator 310, not a digital signal. Such a configuration may adapt the third stage to provide a signal gain of about 20 dB or more over the signal at the out2 495 node because the pFET 510 now contributes to the gain. The pFET 510 may contribute to the gain because the signal at node outln 490 provides a small, common-mode swing with a relatively constant current. In other words, the swing of the signals at nodes outln 490 and out2 495 may have the same direction, in one or more embodiments, causing the pFET 510 to be weaker (i.e., has smaller current) while the nFET 515 is stronger in its pull down (i.e., has larger current). Such a configuration allows the pFET 510 contribute to the gain of the third stage, resulting in a gain of about 20 dB or more.

Additionally, it should be noted that gate of the pFET 510 is not driven by a reference voltage provided from current mirror. By driving the gate of the pFET 510 using a small signal output of the first stage of the comparator 310, there may be no need for a current mirror. That is, a current mirror is no longer necessary to drive the gate of the pFET 510, thus the power consumption of the comparator 310 may be reduced, and any extra circuitry and/or connections needed for a current mirror may be eliminated from the comparator 310 circuit. It is also noted that an additional benefit of the third stage configuration described above is that the gain of the third stage is larger than if the gate of the pFET 510 is driven by a reference voltage from a current mirror. In other words, by driving the gate of the pFET 510 with the small signal at node outln 490, for example, rather than with a reference voltage from a current mirror, a larger gain (e.g., 20 dB or more) may be achieved.

In one or more embodiments, the fourth stage may include the pFETs 520, 530, 540 and 550 as well as the nFETs 525, 535, 545 and 555. In one embodiment, pFET/nFET pairs 520/525, 530/535, 540/545 and/or 550/555 may each respectively be an inverter. In one embodiment, the inverters may be adapted to drive an output signal from the comparator 310. By using a plurality of inverters as drivers in this manner, an output signal from the comparator 310 may be driven on traces and/or connections with high capacitance without losing signal integrity. Additionally, by using a plurality of inverters as drivers in this manner, little or no DC current is added to the circuit in order to drive a large capacitive load. It is contemplated that more or fewer inverters may be used in various embodiments. For example, in one embodiment two pFET/nFET pairs (i.e., two inverters) may be used instead of four, while in another embodiment, six pFET/nFET pairs (i.e., six inverters) may be used.

The signal on the node circuit output 575 may be a single-ended, digital signal. In sum, the first, second and third stages may collectively provide a signal gain of about 60 dB or more over the differential signals at the input terminals inp 410 and inn 415. The exemplary embodiments depicted in FIGS. 2B, 4 and 5, and described above may also allow for a comparator (e.g., comparator 310) to provide a signal gain of about 60 dB or more over the differential signals at the input terminals inp 410 and inn 415 without using a current mirror circuit and without using a current mirror circuit to provide reference and/or bias voltages to one or more stages of the comparator (e.g., comparator 310). The exemplary embodiments depicted in FIGS. 2B, 4 and 5, and described above may also allow for a comparator (e.g., comparator 310) to operate at a current of about 50 μA or less.

Figure 6:
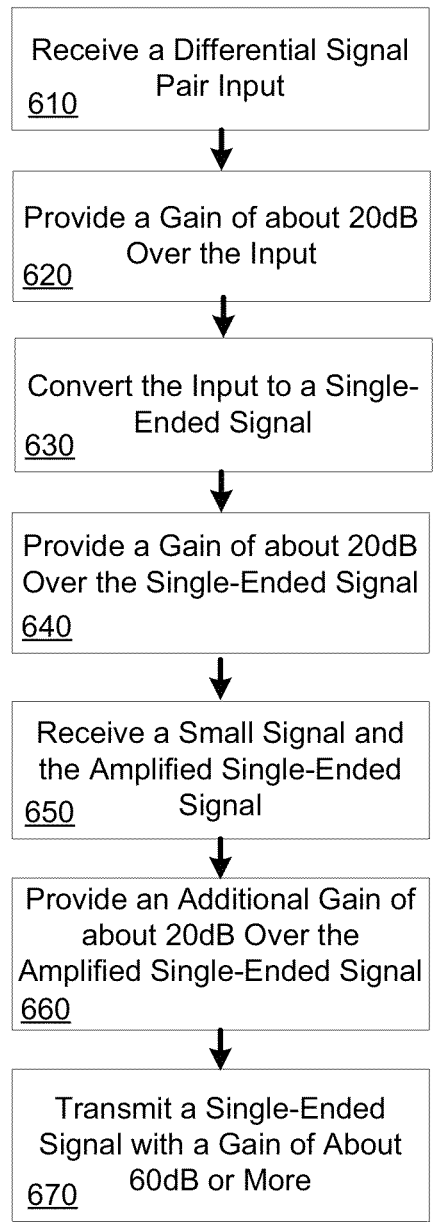
FIG. 6 illustrates a flowchart depicting operation of a circuit for providing a low-current, high-gain is shown, according to one exemplary embodiment.

Turning now to FIG. 6, a flowchart depicting operation of a circuit for providing a low-current, high-gain is shown, in accordance with one or more embodiments. At 610, a differential signal input may be received. In one embodiment, the differential signal input may be received at the first stage of a comparator, as described herein. At 620, a signal gain of about 20 dB or more may be provided (by the first stage of a comparator, as described herein, in one embodiment). At 630, the differential signal input may be converted to a single-ended signal. A gain of about 20 dB or more over the single-ended signal may be provided at 640. In one embodiment, gain of about 20 dB or more over the single-ended signal may be provided at the second stage of a comparator, as described herein. At 650, the amplified single-ended signal and a small signal may be received, and at 660, the signals received at 650 may be used to provide an additional gain of about 20 dB or more over the amplified single-ended signal. In one embodiment, the signals at 650 and the additional 20 dB gain at 660 may be received and provided respectively by a third stage of a comparator, as described herein. At 670, a single-ended signal with a gain of about 60 dB or more may be transmitted. In one embodiment, the signal at 670 may be transmitted by the third comparator stage, as described herein. In another embodiment, the signal at 670 may be transmitted by a fourth stage of a comparator, as described herein.

It is contemplated that the steps as shown in FIG. 6 are not limited to the order in which they are described above. In accordance with one or more embodiments, the steps shown in FIG. 6 may be performed sequentially, in parallel, or in alternate order(s) without departing from the spirit and scope of the embodiments presented herein.

It is also contemplated that, in some embodiments, different kinds of hardware descriptive languages (HDL) may be used in the process of designing and manufacturing very large scale integration circuits (VLSI circuits) such as semiconductor products and devices and/or other types semiconductor devices. Some examples of HDL are VHDL and Verilog/Verilog-XL, but other HDL formats not listed may be used. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units 160, RAMs 155 (including embedded RAMs), compact discs, DVDs, solid state storage and/or the like). In one embodiment, the GDSII data (or other similar data) may be adapted to configure a manufacturing facility (e.g., through the use of mask works) to create devices capable of embodying various aspects described herein, in the instant application. In other words, in various embodiments, this GDSII data (or other similar data) may be programmed into a computer 100, processor 125/140 or controller, which may then control, in whole or part, the operation of a semiconductor manufacturing facility (or fab) to create semiconductor products and devices. For example, in one embodiment, silicon wafers containing one or more I/O interfaces 130, one or more comparators 310, and/or the like may be created using the GDSII data (or other similar data).

It should also be noted that while various embodiments may be described in terms of certain industry standards (such as SuperSpeed USB 3.0) and I/O interfaces, it is contemplated that the embodiments described herein may have a wide range of applicability, not just for I/O interfaces or specific industry data transmission standards, as would be apparent to one of skill in the art having the benefit of this disclosure. For example, the embodiments described herein may be used in comparators for CPUs, GPUs, APUs, chipsets and/or the like, and may be used for data transmission standards such as USB 1.0/2.0, SATA Gen1/2/3, and/or the like. Embodiments presented herein may be used in high-speed data transmission standards, low-speed data transmission standards, and in low-speed transmissions within high-speed standards.

The particular embodiments disclosed above are illustrative only, as the embodiments herein may be modified and practiced in different but equivalent manners apparent to those skilled in the art having the benefit of the teachings herein. Furthermore, no limitations are intended to the details of construction or design as shown herein, other than as described in the claims below. It is therefore evident that the particular embodiments disclosed above may be altered or modified and all such variations are considered within the scope of the claimed invention.

Accordingly, the protection sought herein is as set forth in the claims below.

What is claimed:

1. A method, comprising:
    receiving a differential signal pair input at a first circuit stage;
    converting the differential signal pair input to a single-ended signal at a second circuit stage;
    receiving an output of the first circuit stage and an output of the second stage at a third circuit stage, wherein the output of the first circuit stage and the output of the second stage are separately transmitted to the third circuit stage; and
    transmitting an amplified signal output from the third circuit stage.

2. The method of claim 1, further comprising:
    receiving the amplified signal output at a fourth circuit stage adapted to drive a high-capacitance load; and
    transmitting the amplified signal output from the fourth circuit stage using a plurality of inverters.

3. The method of claim 2, wherein the first, second, third and fourth circuit stages collectively comprise a multi-stage comparator circuit;
    wherein the amplified signal output from the fourth circuit stage has a gain of about sixty decibels over the received differential signal pair input; and
    further comprising providing the gain of about sixty decibels without using a current mirror bias voltage.

4. The method of claim 1, wherein the first circuit stage, the second circuit stage and the third circuit stage each have a signal gain of at least about twenty decibels.

5. The method of claim 1, wherein the output of the first circuit stage is a small signal output comprising a common mode voltage swing.

6. The method of claim 5, wherein the output of the first circuit stage and the output of the second circuit stage have the same voltage swing direction.

7. The method of claim 1, wherein the third circuit stage receives only an output of the first circuit stage and an output of the second stage.

8. A circuit, comprising:
    a first circuit stage that comprises a differential signal pair input portion and a first stage output portion;
    a second circuit stage that comprises a differential signal to single-ended signal converter portion, the second circuit stage being electrically connected to the first circuit stage output portion; and
    a third circuit stage that comprises an amplifier portion and a third circuit stage input portion, wherein the third stage input signal portion is electrically connected to the first circuit stage output portion and separately electrically connected to the second circuit stage output portion.

9. The circuit of claim 8, wherein the amplifier portion of the third circuit stage is adapted to generate an amplified signal based at least upon a signal from the first stage output portion and a signal from the second circuit stage output portion, that further comprises:
    a third circuit stage output portion in the third circuit stage, the third circuit stage output portion being adapted to transmit the amplified signal.

10. The circuit of claim 9, that further comprises:
    a fourth circuit stage that comprises a plurality of inverter elements, the fourth circuit stage being electrically connected to the third circuit stage output portion and being adapted to transmit the amplified signal as an output.

11. The circuit of claim 9, wherein the fourth circuit stage is adapted to transmit the amplified signal output at a gain of about sixty decibels over the received differential signal pair input; and
wherein the circuit is adapted to provide the gain of about sixty decibels without using a current mirror bias voltage; and
wherein the circuit is adapted to operate at a current of about fifty microamperes or less.

12. The circuit of claim 9, wherein the amplified signal generated by the amplifier portion is adapted to produce a gain of at least about twenty decibels over the signal from the second circuit stage output portion, and wherein the third circuit stage is not electrically connected to a current mirror circuit.

13. The circuit of claim 8, wherein the first, the second, and the third circuit stages are each adapted to provide a respective stage gain of about twenty decibels.

14. The circuit of claim 8, wherein the first, second and third circuit stages comprise a comparator circuit adapted to produce a comparator output signal, the comparator output signal having a gain of at least about sixty decibels over a differential signal pair received at the differential signal pair input portion, and wherein providing the gain of about sixty decibels comprises providing the gain without using a current mirror bias voltage.

15. The circuit of claim 8, wherein the third stage input signal portion is electrically connected only to the first circuit stage output portion and to the second circuit stage output portion.

16. A non-transitory, computer readable storage device encoded with data that, when implemented in a manufacturing facility, adapts the manufacturing facility to create an apparatus, wherein the apparatus comprises:
a first circuit stage that comprises a differential signal pair input portion and a first stage output portion;
a second circuit stage that comprises a differential signal to single-ended signal converter portion, the second circuit stage being electrically connected to the first circuit stage output portion; and
a third circuit stage that comprises an amplifier portion and a third circuit stage input portion, wherein the third stage input signal portion is electrically connected to the first circuit stage output portion and separately electrically connected to the second circuit stage output portion.

17. A non-transitory, computer readable storage device, as set forth in claim 16, encoded with data that, when implemented in a manufacturing facility, adapts the manufacturing facility to create an apparatus, wherein the amplifier portion of the third circuit stage is adapted to generate an amplified signal based at least upon a signal from the first stage output portion and a signal from the second circuit stage output portion, wherein the apparatus further comprises:
a third circuit stage output portion in the third circuit stage, the third circuit stage output portion being adapted to transmit the amplified signal.

18. A non-transitory, computer readable storage device, as set forth in claim 17, encoded with data that, when implemented in a manufacturing facility, adapts the manufacturing facility to create an apparatus, wherein the apparatus further comprises:
a fourth circuit stage that comprises a plurality of inverter elements, the fourth circuit stage being electrically connected to the third circuit stage output portion and being adapted to transmit the amplified signal as an output.

19. A non-transitory, computer readable storage device, as set forth in claim 17, encoded with data that, when implemented in a manufacturing facility, adapts the manufacturing facility to create an apparatus, wherein the fourth circuit stage is adapted to transmit the amplified signal output at a gain of about sixty decibels over the received differential signal pair input;
wherein the circuit is adapted to provide the gain of about sixty decibels without using a current mirror bias voltage; and
wherein a circuit stage adapted to provide gain is not electrically connected to a current mirror circuit.

20. A non-transitory, computer readable storage device, as set forth in claim 17, encoded with data that, when implemented in a manufacturing facility, adapts the manufacturing facility to create an apparatus, wherein the amplified signal generated by the amplifier portion is adapted to produce a gain of at least about twenty decibels over the signal from the second circuit stage output portion.

21. A non-transitory, computer readable storage device, as set forth in claim 16, encoded with data that, when implemented in a manufacturing facility, adapts the manufacturing facility to create an apparatus, wherein the first, the second, and the third circuit stages are each adapted to provide a respective stage gain of about twenty decibels, and wherein the circuit is adapted to operate at a current of about fifty microamperes or less.

22. A non-transitory, computer readable storage device, as set forth in claim 16, encoded with data that, when implemented in a manufacturing facility, adapts the manufacturing facility to create an apparatus, wherein the first, second and third circuit stages comprise a comparator circuit adapted to produce a comparator output signal, the comparator output signal having a gain of at least about sixty decibels over a differential signal pair received at the differential signal pair input portion, and wherein providing the gain of about sixty decibels comprises providing the gain without using a current mirror bias voltage.

* * * * *